United States Patent [19]

Manzke

[11] 4,330,707
[45] May 18, 1982

[54] SCANNING ELECTRON MICROSCOPE

[75] Inventor: Klaus D. Manzke, Norderstedt, Fed. Rep. of Germany

[73] Assignee: U.S. Philips Corporation, New York, N.Y.

[21] Appl. No.: 155,270

[22] Filed: Jun. 2, 1980

[30] Foreign Application Priority Data

Jun. 1, 1979 [DE] Fed. Rep. of Germany ....... 2922325

[51] Int. Cl.³ .......................................... G01N 23/00
[52] U.S. Cl. .................................... 250/311; 250/310
[58] Field of Search ............................... 250/311, 310

[56] References Cited

U.S. PATENT DOCUMENTS 3,736,422 5/1973 Weber et al. ...................... 250/311
3,760,180 10/1972 Weber .............................. 250/311
3,792,263 2/1974 Hashimoto et al. ............... 250/311

Primary Examiner—Harold A. Dixon
Attorney, Agent, or Firm—Paul R. Miller

[57] ABSTRACT

A scanning electron microscope, comprises an electron gun, an electron-optical column which comprises an anode for accelerating the electrons, a specimen holder for accommodating and positioning the specimen to be examined being arranged underneath said column, and also a detector for detecting the electrons emerging from the specimen. The detector is connected to a display apparatus for the display of an image of the specimen by way of, for example, detected electrons. Between the electron-optical column and the specimen holder there is arranged a brake electrode. An adjustable voltage which reduces the velocity of the electrons emerging from the electron-optical column can be applied between the brake electrode and the anode.

7 Claims, 1 Drawing Figure

U.S. Patent      May 18, 1982      4,330,707
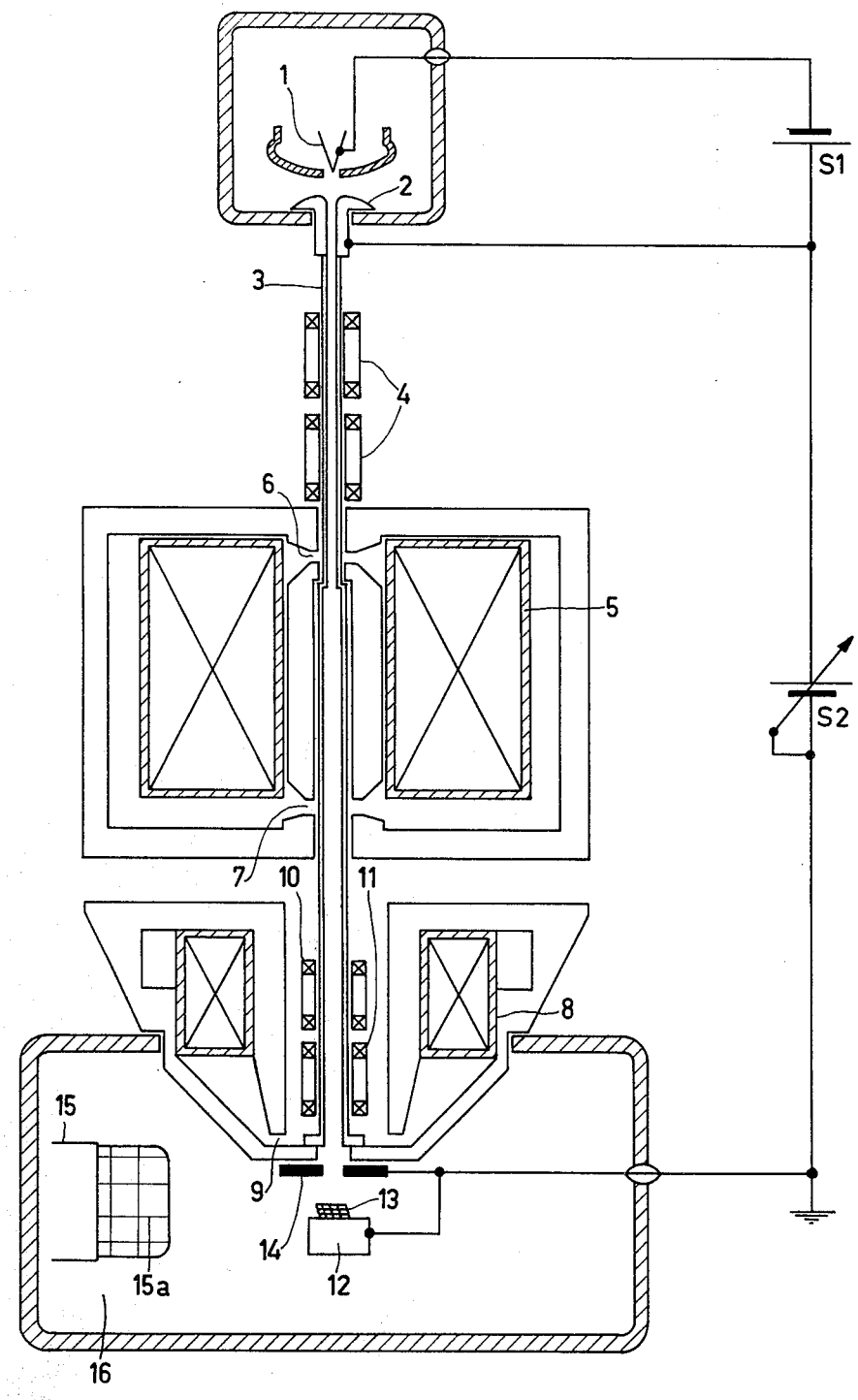

SCANNING ELECTRON MICROSCOPE

The invention relates to a scanning electron microscope, comprising an electron gun, an electron-optical column which comprises an anode for accelerating electrons, and a specimen holder for a specimen to be examined, and also comprising a detector for detecting electrons emerging from the specimen, and a display device for displaying an image of the specimen.

A scanning electron microscope of this kind is known from "Philips Technical Review", Vol. 35, 1975, No. 6, pages 153-165. In an electron-optical column thereof, electrons emerging from an electron gun are accelerated to a desired speed by means of an anode, are focused and are deflected by means of deflection coils. After departure from the electron-optical column, the electrons reach the specimen to be examined and generate secondary electrons having material-specific or topography-specific properties, with the secondary electrons being detected by detectors.

In many cases it is desirable to adapt the velocity of the electrons of the electron beam, for example, to properties of the specimen to be detected. For example, for the detection of semiconductor structures having a high integration degree by means of the potential difference method (page 154, first column, fifth paragraph, eighth line and further), according to this article it is desirable that, in order to obtain a high resolving power (page 156, first column, third paragraph (in addition to suitable dosability of the radiation intensity (page 156, second column) the velocity of the electrons incident on the specimen to be examined is comparatively low. The resolving power of a scanning electron microscope generally is not exclusively dependent of optical quantities such as, for example, lens defects, lens apertures and the diameter of the electron beam on the specimen. The diffusion length of the electrons in the specimen and the penetration depth thereof also have an effect such that the resolving power is higher as the diffusion length is shorter and hence the energy or the velocity of the electrons is smaller, or lower.

The energy selection of the secondary electrons generated in the specimen then offers the possibility of obtaining an image of potential differences on the specimen surface so that, for example, integrated circuits in operation can be tested as regards construction as well as regards operation (see, for example, L. Reimer, G. Pfefferkorn: Rasterelektronenmikroskopie, 1977, page 146).

Changing of the energy or the intensity of the electron beam for adaptation to each time the specimen properties, however, necessitates a variation of the acceleration voltage, so that each time a variation of the focusing and deflection voltages is necessary.

Moreover, it has been found that the electron beam is insufficiently stable at low acceleration voltages, for example, due to contaminations in the path to be followed by the electron beam. These contaminations are partly residues of pumping oil cracked by the electron beam. Therefore, stable operation of a scanning electron microscope at low acceleration voltages requires a high vacuum which is free of oil as well as possible; however, such a vacuum can be realized only by comparatively long pumping periods.

It is an object of the invention to provide a scanning electron microscope of the described kind in which variation of the velocity of the electron beam incident on the specimen does not necessitate refocusing of the electron beam within the electron-optical column and in which the electron beam is sufficiently stable even in the case of a comparatively low velocity of the electrons incident on the specimen.

This object is achieved in accordance with the invention in that between the electron-optical column and the specimen holder there is arranged a brake electrode, it being possible to apply an adjustable voltage which reduces the velocity of the electrons emerging from the electron-optical column between the brake electrode and the anode.

Thus, between the cathode and the anode there is present a first voltage which accelerates the electrons and which can be adjusted, for example, to a constant value, while between the anode and the brake electrode there is present a second variable voltage of reverse polarity with respect to the first voltage, so that the velocity of the electrons emerging from the electron-optical column can be reduced in accordance with the kind of specimen to be examined. The first constant voltage which is present between the cathode and the anode is comparatively high. It is thus achieved that the electron beam travels at a constant, high speed through the electron optical column and is insensitive to contaminations such as cracking products.

If the velocity of the electrons reaching the specimen is to be reduced, only the second voltage between the anode and the brake electrode is adjusted accordingly, while the first voltage between the electron gun (cathode) and the anode remains constant.

It is thus achieved that, each time when the electron velocity is changed exclusively by means of the second voltage which can be adjusted, for example, to a constant value, a corresponding adaptation of the deflection and focusing voltages within the electron-optical column can be dispensed with. Moreover, after emerging from the electron-optical column or after passage of a last aperture, the electron beam travels only a comparatively short distance at a low velocity until it reaches the specimen, so that stable operation of the scanning electron microscope is ensured.

Furthermore, as a result of the high velocity of the electron beam within the electron-optical column, the requirements to be imposed as regards the quality of the vacuum are less severe, thus resulting in shorter pumping periods.

The drawing shows an embodiment in accordance with the invention.

The drawing FIGURE diagrammatically shows a scanning electron microscope which comprises a cathode 1 for generating free electrons, and an anode 2 for accelerating the electrons arranged opposite the cathode. Between the cathode 1 and the anode 2 there is arranged a voltage source S1 for a constant voltage U1, of, for example, 10 kV. Consequently, electrons emerging from the cathode 1 enter a tube 3 at a comparatively high velocity; this tube adjoins the anode 2, is preferably made of a non-magnetic material and is conductively connected to the anode 2. Around the tube 3 there are arranged coils 4 for the centering and focusing of the electron beam, and a coil 5 for forming two condensor lenses 6 and 7. The condensor lenses 6 and 7 are followed by a further coil 8 which surrounds the tube 3 and which forms an objective lens 9. The coil 8 encloses two deflection coils 10 and 11 for scanning a surface of a specimen 13, arranged on a specimen holder 12 (goniometer) underneath the tube 3, by means of the electron beam.

Between an end of the tube 3 which at the same time forms the end of the electron optical column and the specimen holder 12 there is arranged a brake electrode 14 which is electrically connected to the specimen holder 12 and which is at ground potential, and the brake electrode is connected to the negative pole of a second voltage source S2 which is arranged between the brake electrode and the anode 2. The brake electrode 14 may be shaped, for example, as a disc and may comprise an aperture, situated in the center of the disc, for the passage of the electrons, or it may be constructed as a hollow cylinder.

The voltage U2 of the voltage source S2 can be adjusted to several constant values so that the electrons emerging from the tube 3 of the electron optical column can reach the specimen 13 to be examined with a desired, comparatively small energy or low velocity. For example, the voltage U2 may assume values from 0 to −10 kV. The value of the voltage U2 is preselected in accordance with the nature of the specimen 13 and the method of examination (for example, potential difference method).

The detection of the electrons (secondary electrons) released from the specimen 13 or the energy selection thereof can be realized, for example, by means of a photomultiplier tube comprising a scintillator and a counter-field electrode (gauze 15a), or another suitable electron detector, arranged within an evacuated examination space 16 together with the specimen 13.

Alternatively, an additional, periodical, for example, squarewave or sinusoidal voltage can be applied to the brake electrode 14 which is situated just below the electron-optical column with the periodical voltage being superposed on the constant second voltage U2. This is necessary for the testing of the operation of integrated semiconductor circuits, for example, for stroboscopic examination of electric potantials which vary very quickly within the circuits or on the specimen (L. Reimer, G. Pfefferkorn: Rasterelektronenmikrosopie (1977), page 149, chapter 4.5.4). An examination of this kind is performed at low electron velocities, so that braking of the electrons emerging from the tube 3 at a high velocity is desirable.

What is claimed is:

1. A scanning electron microscope comprising an electron gun including a cathode for generating electrons, an anode for accelerating electrons, an electron-optical column for guiding electrons, a specimen holder for accommodating and positioning a specimen to be examined, a brake electrode arranged between said electron-optical column and said specimen, means for applying a first voltage between said cathode and said anode to accelerate electrons, means for applying a second adjustable voltage between said anode and said brake electrode, said second voltage being of reverse polarity with respect to said first voltage, and said second voltage being adjusted in accordance with the kind of specimen to be examined, a detector for detecting electrons emerging from said specimen, and a display device for displaying an image of said specimen.

2. A scanning electron microscope according to claim 1, wherein said first voltage is a selected constant high value voltage.

3. A scanning electron microscope according to either claim 1 or 2, wherein said second voltage reduces the velocity of electrons emerging from said electron-optical column.

4. A scanning electron microscope according to claim 1, wherein said second voltage is a direct voltage applied between said anode and said brake electrode.

5. A scanning electron microscope according to claim 1, wherein a periodical voltage is superimposed on said second voltage.

6. A scanning electron microscope according to claim 1, wherein said brake electrode is located after the end of said electron-optical column and slightly separated from said specimen.

7. A scanning electron microscope according to claim 1, wherein said second voltage may be varied in selected values between 0 and −10 kV.

* * * * *